US011655968B2

(12) United States Patent
Suzuki et al.

(10) Patent No.: US 11,655,968 B2
(45) Date of Patent: May 23, 2023

(54) LIGHT-EMITTING MODULE

(71) Applicant: KOITO MANUFACTURING CO., LTD., Tokyo (JP)

(72) Inventors: Tetsuya Suzuki, Shizuoka (JP); Tomoyuki Ichikawa, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 17/478,145

(22) Filed: Sep. 17, 2021

(65) Prior Publication Data
US 2022/0090767 A1    Mar. 24, 2022

(30) Foreign Application Priority Data

Sep. 24, 2020  (JP) .............................. JP2020-160185
Sep. 24, 2020  (JP) .............................. JP2020-160186

(51) Int. Cl.
| | |
|---|---|
| *F21V 19/00* | (2006.01) |
| *H01L 25/075* | (2006.01) |
| *F21V 23/00* | (2015.01) |
| *H01L 33/62* | (2010.01) |
| *H01L 33/58* | (2010.01) |

(52) U.S. Cl.
CPC ........ *F21V 19/0015* (2013.01); *F21V 23/005* (2013.01); *H01L 25/0753* (2013.01); *H01L 33/58* (2013.01); *H01L 33/62* (2013.01)

(58) Field of Classification Search
CPC .. F21V 19/0015; F21V 23/005; F21V 23/004; H01L 25/0753; H01L 33/58; H01L 33/62; H01L 33/64; H01L 25/167; F21Y 2115/10
See application file for complete search history.

(56) References Cited

U.S. PATENT DOCUMENTS

| | | | |
|---|---|---|---|
| 2004/0065894 A1* | 4/2004 | Hashimoto | ........... H01L 33/642 257/E25.032 |
| 2005/0073846 A1* | 4/2005 | Takine | ................... H01L 33/64 362/296.04 |
| 2011/0095310 A1* | 4/2011 | Komatsubara | ...... H01L 25/0753 257/E33.072 |

FOREIGN PATENT DOCUMENTS

| | | | | |
|---|---|---|---|---|
| JP | 2003069083 A | * | 3/2003 | |
| JP | 2003152225 A | * | 5/2003 | ........... H01L 33/642 |
| JP | 2016-139514 A | | 8/2016 | |
| JP | 2016139514 A | * | 8/2016 | |

OTHER PUBLICATIONS

English Translation of JP-2003069083-A; Hashimoto, T; (Year: 2003).*

* cited by examiner

*Primary Examiner* — Jong-Suk (James) Lee
*Assistant Examiner* — Glenn Zimmerman
(74) *Attorney, Agent, or Firm* — Sughrue Mion, PLLC

(57) ABSTRACT

A light-emitting module includes: a semiconductor light-emitting element; a circuit board on which a lighting control circuit configured to perform control to turn on and off the semiconductor light-emitting element is provided; and an element metal plate on which the semiconductor light-emitting element is mounted. The circuit board is a resin substrate in which a wiring portion connecting the semiconductor light-emitting element and the lighting control circuit is provided.

7 Claims, 9 Drawing Sheets

LIGHT-EMITTING MODULE

CROSS-REFERENCE TO RELATED APPLICATION

This application claims priority to Japanese Patent Application No. 2020-160185 filed on Sep. 24, 2020 and Japanese Patent Application No. 2020-160186 filed on Sep. 24, 2020, each incorporated herein by reference in its entirety.

BACKGROUND

1. Technical Field

The disclosure relates to a light-emitting module.

2. Description of Related Art

There has been a light source module including a driver unit mounted in a heatsink including radiating fins, the driver unit including a light-emitting diode and a drive circuit for performing lighting control for the light-emitting diode (see Japanese Unexamined Patent Application Publication No. 2016-139514). In this light source module, an electric power feeding attachment with bus-bars embedded therein is mounted on the heatsink. The bus-bars electrically connect the driver unit and the light-emitting diode.

SUMMARY

However, the above electric power feeding attachment is formed via insert molding in order for many bus-bars to be embedded therein, and the electric power feeding attachment includes many components. Thus it is not easy to manufacture the electric power feeding attachment. Therefore, there is room for further improvement from the perspective of costs.

The disclosure provides a novel light-emitting module that enables cost reduction with a simplified configuration.

A light-emitting module according to a first aspect of the disclosure includes a semiconductor light-emitting element; a circuit board on which a lighting control circuit configured to perform control to turn on and off the semiconductor light-emitting element is provided; and an element metal plate on which the semiconductor light-emitting element is mounted. The circuit board is a resin substrate in which a wiring portion connecting the semiconductor light-emitting element and the lighting control circuit is provided.

According to the first aspect, the lighting control circuit and the semiconductor light-emitting element can be connected with a simple configuration.

In the light-emitting module according to the first aspect, the circuit board may be a multilayer substrate, and the wiring portion may be provided inside the multilayer substrate. The resin substrate is, for example, a glass epoxy substrate with a copper foil pattern formed as a wiring portion on a surface of the substrate and an inside of the substrate. Accordingly, in comparison with components having a large thickness and requiring high costs for material and high manufacturing costs such as an electric power feeding attachment with bus-bars provided therein, the circuit board enables cost reduction.

In the light-emitting module according to the first aspect, the circuit board may be mounted on the element metal plate, and the wiring portion may be provided between the lighting control circuit and the element metal plate. The lighting control circuit may be mounted on a surface of the circuit board.

In the light-emitting module according to the first aspect, the semiconductor light-emitting element may be disposed in an opening provided in the circuit board. Accordingly, the semiconductor light-emitting element can directly be mounted on the element metal plate.

In the light-emitting module according to the first aspect, the semiconductor light-emitting element may be connected to the wiring portion via a metal wire such as a gold wire, an aluminum wire or an aluminum ribbon. Accordingly, reliability of connection between an electrode pad of the semiconductor light-emitting element and the wiring portion can be enhanced. Also, use of the metal wire enables reduction in area of the electrode pad.

The light-emitting module according to the first aspect may further include a circuit metal plate that is different from the element metal plate. The circuit board may be mounted in such a manner as to extend on the element metal plate and the circuit metal plate, and the element metal plate and the circuit metal plate may be thermally separated from each other. Accordingly, it is possible to set a shape and a size of the element metal plate in consideration of heat generated by the semiconductor light-emitting element and to set a shape and a size of the circuit metal plate in consideration of heat generated by the lighting control circuit. This enhances a degree of flexibility of settings.

In the light-emitting module according to the first aspect, the element metal plate may be a single plate member, a cutout portion in which the circuit metal plate is inserted may be provided in an outer peripheral portion of the element metal plate, and the element metal plate and the circuit metal plate inserted in the cutout portion may form a rectangular shape as a whole. Accordingly, the entirety of the two plates forms a simple shape, thereby increasing a degree of flexibility of layout.

In the light-emitting module according to the first aspect, the element metal plate may have a thickness of 1 mm to 2 mm. Accordingly, the light-emitting module can be made thin.

Note that any combination of the above components, and a method, an apparatus, a system, and the like that are obtained by converting the expression of the disclosure are also effective as aspects of the disclosure.

According to the first aspect of the disclosure, it is possible to provide the novel light-emitting module that enables cost reduction.

A light-emitting module according to a second aspect of the disclosure includes a semiconductor light-emitting element; an element metal plate on which the semiconductor light-emitting element is mounted; a wiring board mounted on the element metal plate; and a circuit board on which a lighting control circuit configured to control lighting of the semiconductor light-emitting element is provided. An opening portion for mounting the semiconductor light-emitting element on the element metal plate is provided in the wiring board. In the opening portion, a part of wiring provided inside the wiring board is exposed. The opening portion has a depth enough to surround a connecting member connecting the semiconductor light-emitting element and the exposed part of the wiring.

According to the second aspect, the lighting control circuit and the semiconductor light-emitting element can be connected with a simple configuration. Also, since the opening portion has a depth enough to surround the connecting member, the connecting member is less likely to come into contact with other components.

In the light-emitting module according to the second aspect, the connecting member may be a metal wire such as a gold wire, an aluminum wire or an aluminum ribbon, and the opening portion may be configured such that the metal wire does not project from a surface of the wiring board. Accordingly, it is possible to avoid a situation where the metal wire contacts other components that the metal wire should not contact. Thus, the metal wire does not need to be coated with, for example, an insulating protection resin.

In the light-emitting module according to the second aspect, the wiring board may be a resin substrate formed integrally with the element metal plate and the wiring made of metal, the opening portion may be a recess portion that receives the semiconductor light-emitting element, and the part of the wiring may be exposed from a side wall of the recess portion. Accordingly, the metal wire is connected to the part of the wiring without projecting from the surface of the wiring board.

In the light-emitting module according to the second aspect, the circuit board may be a multilayer substrate including a resin that is any one of a phenol resin, an epoxy resin and a polyimide resin, and wiring provided inside the resin, and the wiring board may include an engineering plastic and the wiring provided inside the engineering plastic.

In the light-emitting module according to the second aspect, the wiring board and the circuit board may be included in a common single substrate. Accordingly, the number of substrates is reduced, thereby enabling reduction of costs and manhours for assembly.

The light-emitting module according to the second aspect may further include a circuit metal plate that is different from the element metal plate. The circuit board may be mounted in such a manner as to extend on the element metal plate and the circuit metal plate, and the element metal plate and the circuit metal plate may be thermally separated from each other. Accordingly, it is possible to set a shape and a size of the element metal plate in consideration of heat generated by the semiconductor light-emitting element and to set a shape and a size of the circuit metal plate in consideration of heat generated by the lighting control circuit. This enhances a degree of flexibility of settings.

In the light-emitting module according to the second aspect, the element metal plate may be a single plate member, a cutout portion in which the circuit metal plate is inserted may be provided in an outer peripheral portion of the element metal plate, and the element metal plate and the circuit metal plate inserted in the cutout portion may form a rectangular shape as a whole. Accordingly, the entirety of the two plates forms a simple shape, thereby increasing a degree of flexibility of layout.

In the light-emitting module according to the second aspect, the element metal plate may have a thickness of 1 mm to 2 mm. Accordingly, the light-emitting module can be made thin.

The light-emitting module according to the second aspect may further include a plurality of the opening portions that are provided in such a manner as to be spaced from each other, and the semiconductor light-emitting element may be disposed in each of the opening portions. Accordingly, it is possible to provide a plurality of light sources that are different in light distribution in a single light-emitting module.

Note that any combination of the above components and a method, an apparatus, a system, and the like that are obtained by converting the expression of the disclosure are also effective as aspects of the disclosure.

According to the second aspect of the disclosure, it is possible to provide a novel light-emitting module that enables cost reduction.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Embodiments of the disclosure will be described in detail below with reference to the drawings. In the description of the drawings, same components are provided with a same sign and overlapping description thereof is appropriately omitted. Also, the below-described configurations are merely examples and do not limit the scope of the disclosure in any way.

First Embodiment

Vehicle Lamp

Figure 1:
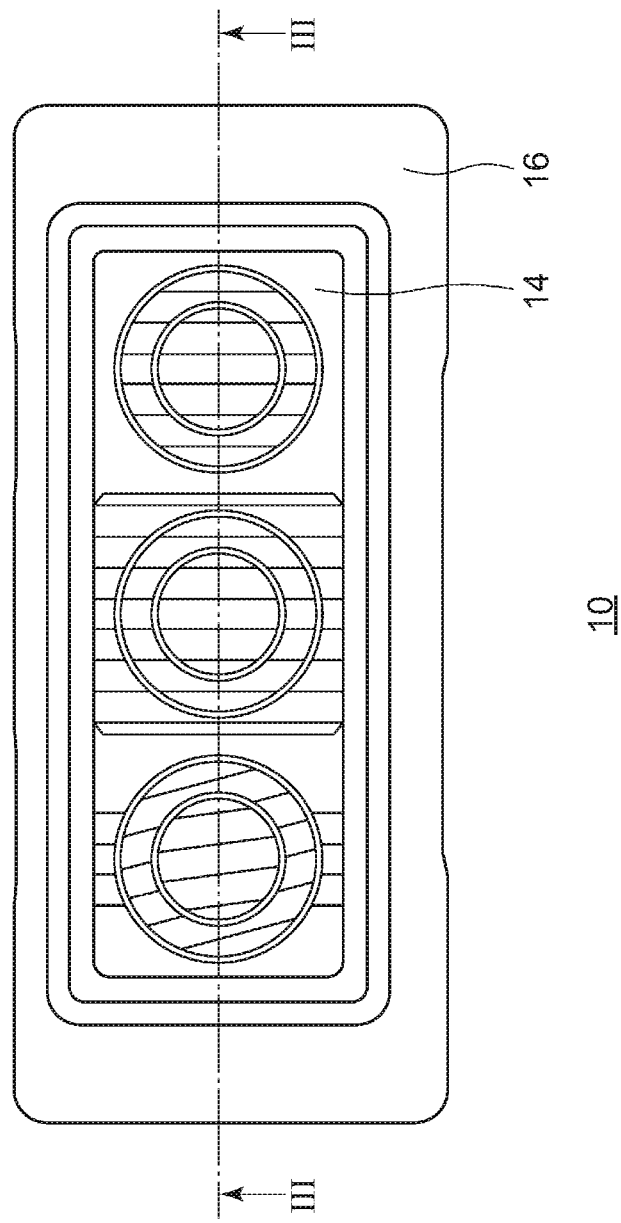
FIG. 1 is a front view of a vehicle lamp according to a first embodiment.
Figure 2:
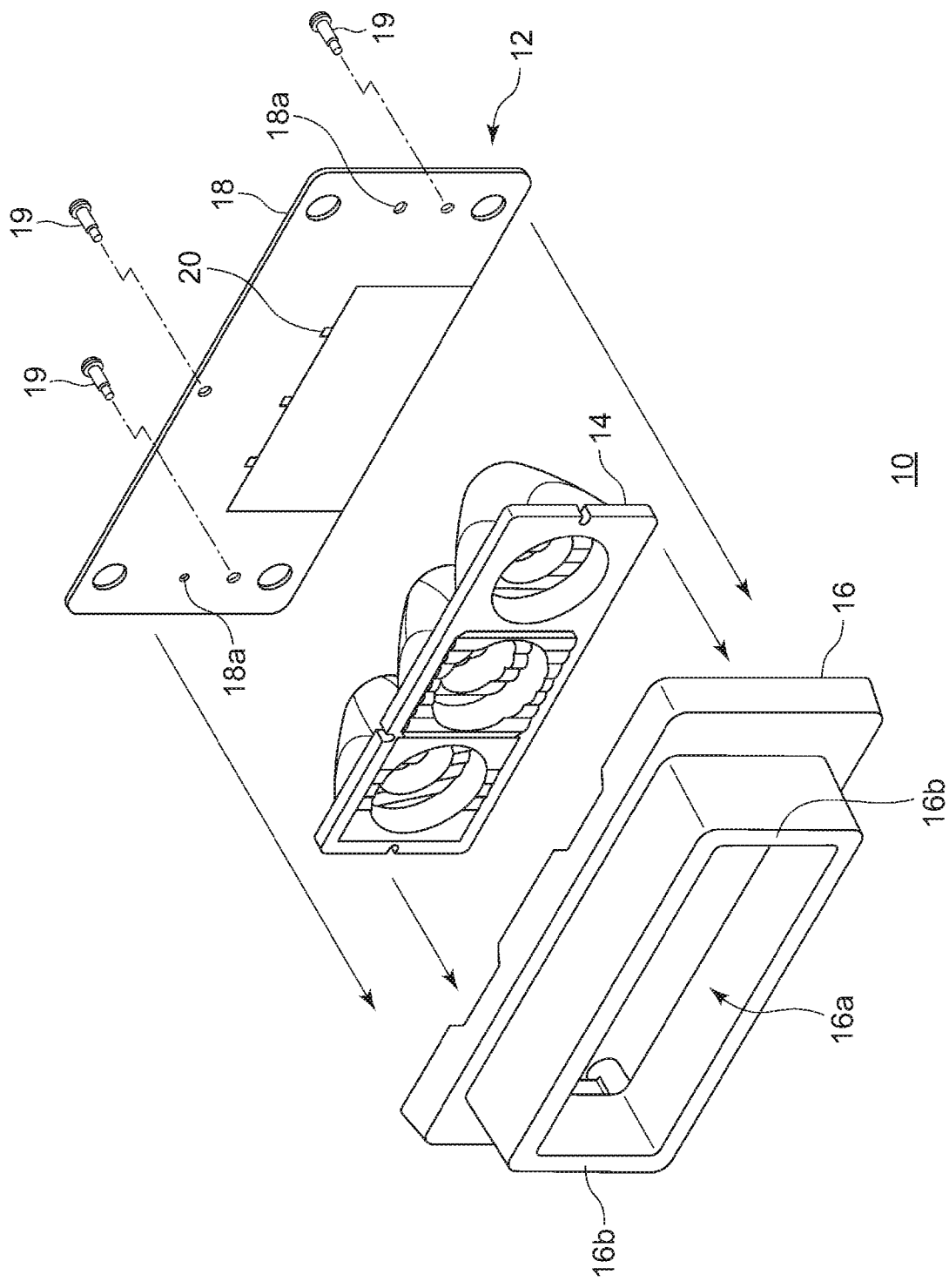
FIG. 2 is an exploded perspective view of the vehicle lamp according to the first embodiment.
Figure 3:
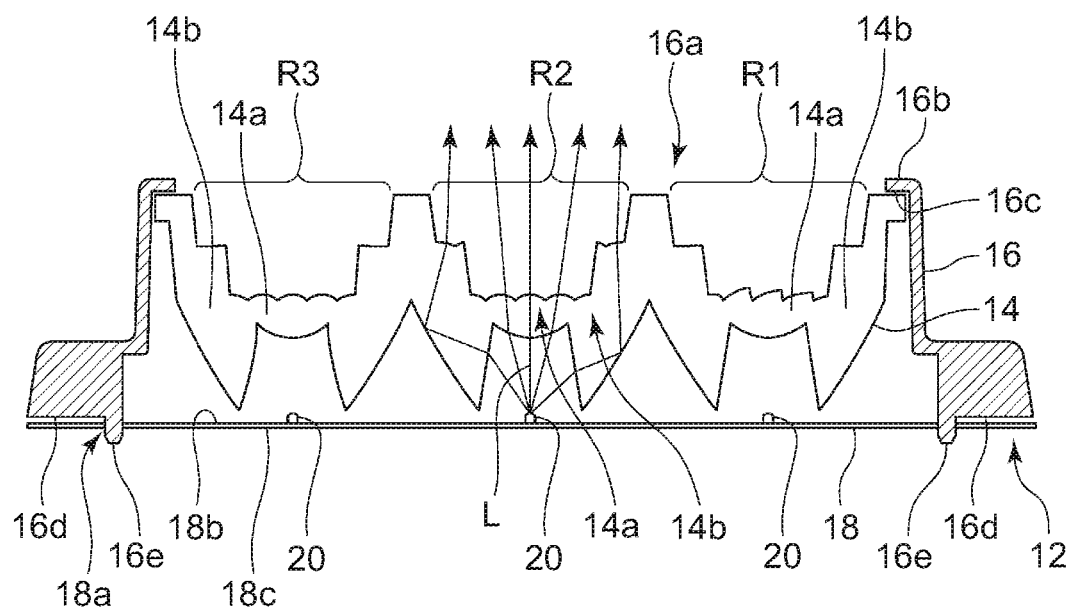
FIG. 3 is a sectional view of the vehicle lamp taken along a line III-III in FIG. 1.

FIG. 1 is a front view of a vehicle lamp according to a first embodiment. FIG. 2 is an exploded perspective view of the vehicle lamp according to the first embodiment. FIG. 3 is a sectional view of the vehicle lamp taken along a line III-III in FIG. 1.

A vehicle lamp 10 includes a light-emitting module 12, a lens 14 and a holder 16. The light-emitting module 12 includes a metal plate 18 formed of, e.g., aluminum or copper, and three semiconductor light-emitting elements (light-emitting diodes 20) that are mounted on the metal plate 18, and that are separate light sources. Each of the semiconductor light-emitting elements may be a laser element or an EL element. The lens 14 includes three optical control regions R1 to R3. In each of the optical control regions R1 to R3, an optical path is controlled such that light L emitted from the relevant light-emitting diode 20 enters the optical control region, travels through the inside of the optical control region and exits forward from the optical control region. The holder 16 holds the lens 14 in a state in which the lens 14 is positioned relative to the holder 16. Also, the metal plate 18 is fixed to the holder 16 via three screws 19 in a state in which the metal plate 18 is positioned relative to the holder 16.

In this way, in the vehicle lamp 10 according to the present embodiment, the metal plate 18 and the lens 14 are positioned relative to a same component, that is, the holder 16. This enhances accuracy of positioning the metal plate 18 and the lens 14. In other words, accuracy of positions of the metal plate 18 and the lens 14 relative to each other is enhanced. This enables forming a desired light distribution pattern projected forward of the vehicle with good accuracy.

The lens 14 does not project forward from an opening portion 16a of the holder 16. The entire lens 14 is provided on the metal plate 18-side relative to the opening portion 16a (i.e., the entire lens 14 is provided closer to the metal plate 18 than the opening portion 16a is). In other words, the entirety of the lens 14 falls within a region between the holder 16 and the metal plate 18. Each of the optical control regions R1 to R3 of the lens 14 includes a center portion 14a that refracts light L from the relevant light-emitting diode 20 and makes the light L exit forward, and an outer edge portion 14b at the periphery of the center portion 14a, the outer edge portion 14b reflecting the entering light L from the relevant light-emitting diode 20 with the use of an inner surface and makes the light L exit forward. Consequently, although the lens 14 does not have a shape projecting from the holder like a convex lens, the lens 14 can form a desired light distribution pattern, thereby enabling reduction in thickness in a vehicle front-rear direction of the vehicle lamp 10.

Next, positioning of components in the vehicle lamp 10 according to the present embodiment will be described. The holder 16 includes a flange portion 16b in such a manner as to surround the opening portion 16a. The lens 14 is fixed to a positioning portion 16c provided on the inner side of the flange portion 16b. Consequently, the lens 14 can be assembled to the holder 16 from the rear side of the holder 16 and positioned.

Also, positioning holes 18a into which positioning protrusions 16e provided at a rear-side end surface 16d of the holder 16 are inserted are formed in the metal plate 18. By the protrusions 16e being fitted in the positioning holes 18a, the metal plate 18 is positioned relative to the holder 16.

Here, the metal plate 18 is a metal plate having a thickness of 1 mm to 2 mm and a surface of the metal plate 18 is blackened by, e.g., anodizing treatment or painting, thereby enhancing emissivity of heat from the metal plate 18. Thus, i) a surface 18c, which is on the side opposite to a mounting surface 18b on which the light-emitting diodes 20 are mounted, is exposed to the outside, ii) emissivity of heat from the metal plate 18 is enhanced, and iii) the plurality of light-emitting diodes 20 are dispersedly arranged at intervals. The combination of, for example, the above-mentioned features i), ii), and iii) enables the light-emitting module 12 to achieve desired heat dissipation performance with no need for a heatsink for mounting the metal plate 18. Consequently, the thickness in the vehicle front-rear direction of the vehicle lamp 10 can be reduced.

Figure 4:
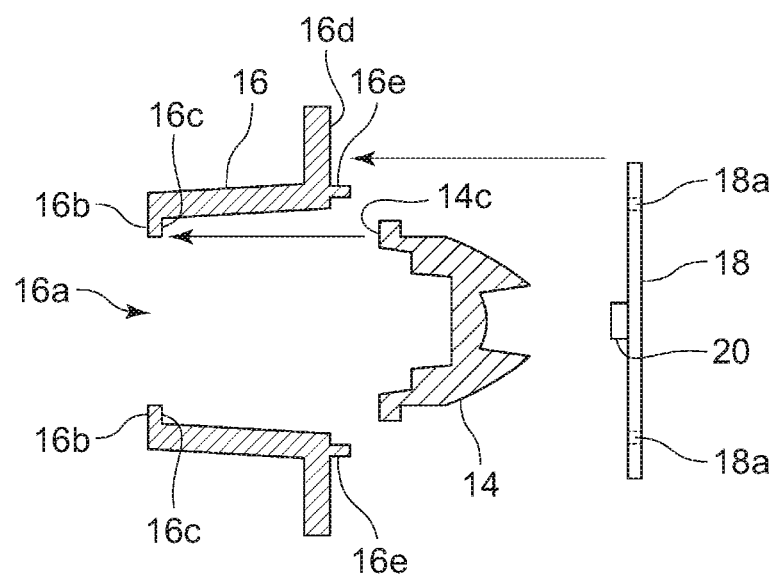
FIG. 4 is a schematic view for describing a method for manufacturing the vehicle lamp according to the first embodiment.

FIG. 4 is a schematic diagram for describing a method for manufacturing the vehicle lamp according to the first embodiment. Note that FIG. 4 is an exploded view of the vehicle lamp as viewed from a lateral side.

As illustrated in FIG. 4, the manufacturing method according to the present embodiment includes a preparation step of preparing a tubular holder 16 including an opening portion 16a from which light from light-emitting diodes 20 exit; a lens positioning step of positioning a front end surface 14c of a lens 14 on a positioning portion 16c formed on the inner side (substrate side) of the opening portion 16a in such a manner as to surround the opening portion 16a; and a substrate positioning step of positioning a metal plate 18 on which the light-emitting diodes 20 are mounted, on fixing portions (protrusions 16e at a rear-side end surface 16d) on the side opposite to the opening portion 16a of the holder 16.

In the lens positioning step and the substrate positioning step, the lens 14 and the metal plate 18 can be assembled to the holder 16 from the same side. Also, in a state in which the front end surface 14c is brought in abutment with the positioning portion 16c of the holder 16, the lens 14 is welded and fixed to the holder 16 by applying laser to the region of the abutment from behind the lens 14. Also, in a state in which the metal plate 18 is brought in abutment with the rear-side end surface 16d of the holder 16 and the protrusions 16e are inserted in the positioning holes 18a, the metal plate 18 is welded and fixed to the holder 16 by applying laser to the vicinities of the protrusions 16e projecting from the back side of the metal plate 18, from behind. Alternatively, after positioning through insertion of the protrusions 16e into the positioning holes 18a, the metal plate 18 is fixed to the holder 16 by performing fastening via screws using other holes provided for fixing.

According to this mode, the lens positioning step and the substrate positioning step can be performed via welding using laser emitted from the same side. This reduces change in the orientation of a laser welding apparatus or the rotation of components such as the lens and the holder at the time of manufacture. Also, since the welded part of the lens 14 that is welded to the holder 16 is located on the inner side (back side) of the flange portion 16b, the welded part cannot be seen when the vehicle lamp 10 is viewed from the front and thus, enhancement in appearance is achieved. Also, light passing through the welded part is blocked by the flange portion 16b. This reduces leakage of uncontrolled light such as glare to the outside. Alternatively, in fastening via, e.g., screws, assembling works can be performed from the same side, thereby enabling enhancement in work efficiency and curbing of occurrence of a defect due to misassembling.

Light-Emitting Module

Figure 5:
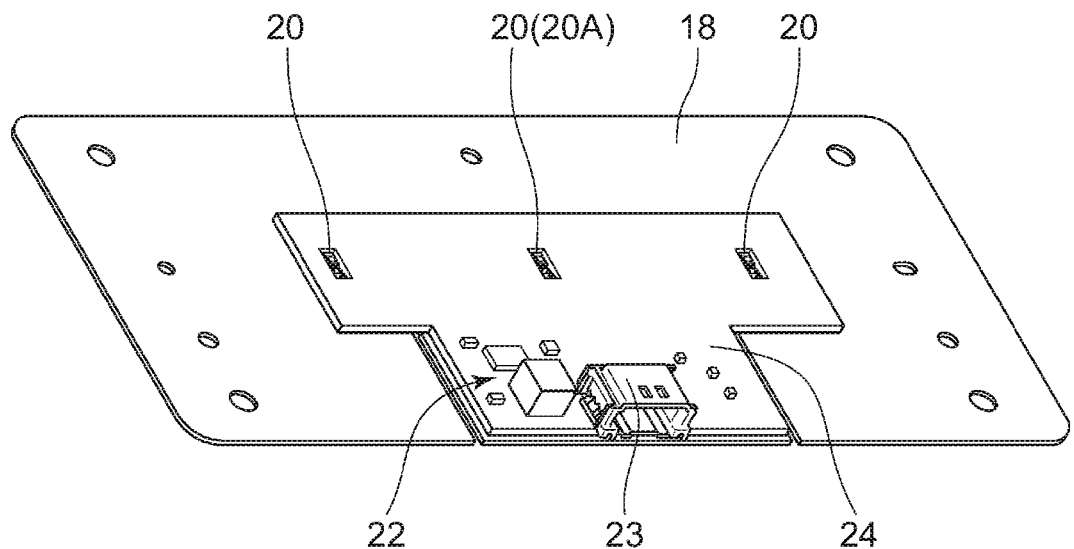
FIG. 5 is a perspective view of a light-emitting module according to the first embodiment as viewed from above.
Figure 6:
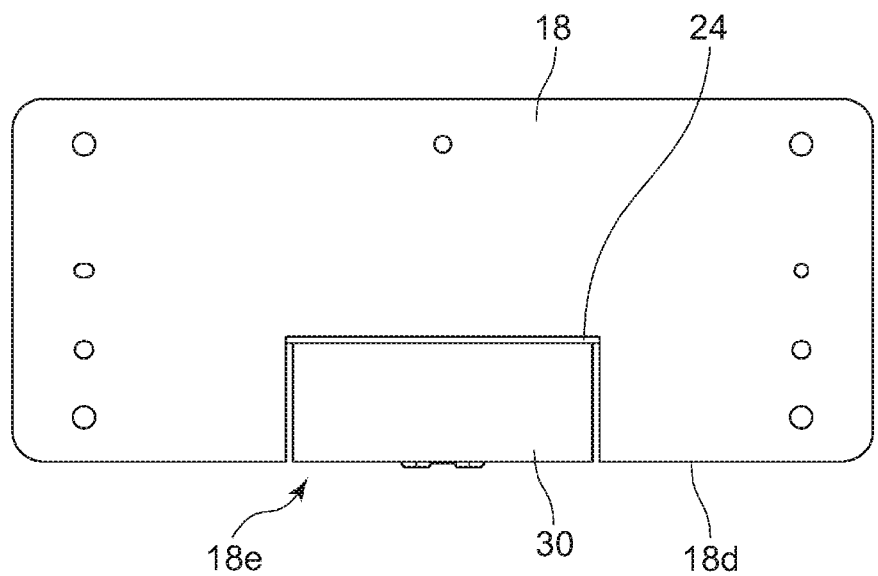
FIG. 6 is a back view of the light-emitting module according to the first embodiment.
Figure 7:
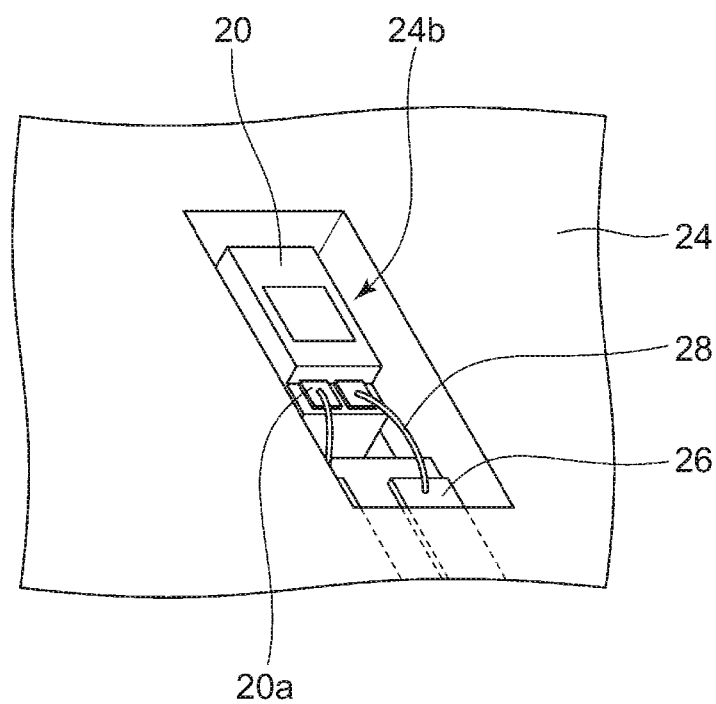
FIG. 7 is an enlarged view of the vicinity of an opening portion of the light-emitting module illustrated in FIG. 5.
Figure 8:
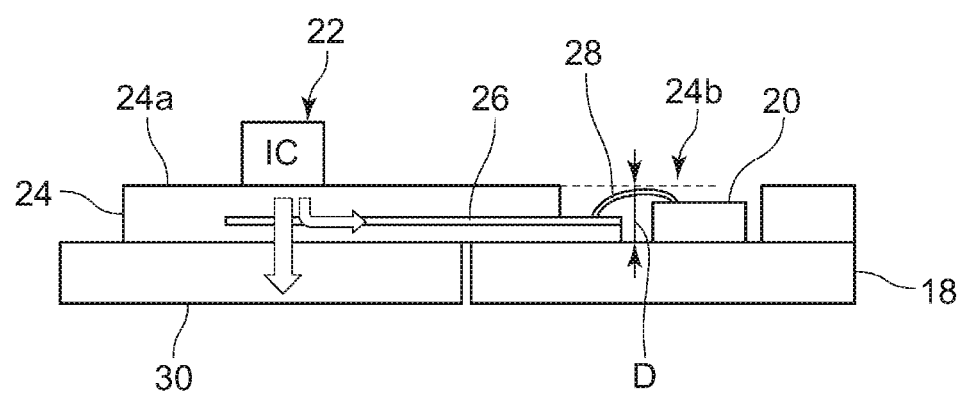
FIG. 8 is a schematic view of a section including an opening portion of the light-emitting module according to the first embodiment.

Next, one example of the light-emitting module will be described. FIG. 5 is a perspective view of the light-emitting module according to the first embodiment as viewed from above. FIG. 6 is a back view of the light-emitting module according to the first embodiment. FIG. 7 is an enlarged view of the vicinity of an opening portion of the light-emitting module illustrated in FIG. 5. FIG. 8 is a schematic diagram of a section including an opening portion of the light-emitting module according to the first embodiment.

The light-emitting module 12 includes a circuit board 24 provided with the three light-emitting diodes 20, a lighting control circuit 22 that performs control to turn on and off the light-emitting diodes 20 and a connector 23 to which an external connector is connected, and the metal plate 18 that is an element metal plate on which the light-emitting diodes 20 are mounted. The circuit board 24 is a multilayer resin substrate, and a wiring portion 26 is provided inside the multilayer resin substrate. The wiring portion 26 connects the light-emitting diodes 20 and the lighting control circuit 22. Consequently, as illustrated in FIG. 8, the lighting control circuit 22 and the light-emitting diode 20 can be connected with a simple configuration. Here, the lighting control circuit 22 includes passive elements necessary for driving the light-emitting diodes 20 (for example, a resistor, a coil and a capacitor) and active elements (for example, a transistor, an IC, a diode and an operational amplifier).

The circuit board 24 according to the present embodiment is a multilayer substrate including the wiring portion 26 provided inside the multilayer substrate and on a surface layer of the multilayer substrate. The circuit board 24 is, for example, a glass epoxy substrate with a copper foil pattern formed as a wiring portion on a surface and inside the glass epoxy substrate. Consequently, in comparison with components having a large thickness and requiring high costs for material and high manufacturing costs such as an electric power feeding attachment with bus-bars provided therein, the circuit board 24 enables cost reduction. Note that the circuit board may be configured by a phenol resin or a polyimide resin. Also, the wiring portion 26 exposed in opening portions 24b has been subjected to metal-surface treatment (e.g., nickel plating or gold plating). Consequently, bondability of metal wires 28 such as gold wires, aluminum wires or aluminum ribbons are improved. Also, a rear-side surface layer of the circuit board 24 is configured by an insulating material alone. The rear-side surface layer is in contact with the metal plate 18. Consequently, when the circuit board 24 is bonded to the electrically conductive metal plate 18, it is possible to use not only an electrically insulating adhesive having good heat dissipation performance but also an electrically conductive adhesive.

As illustrated in FIG. 8, at least a part of the circuit board 24 is mounted on the metal plate 18, and the wiring portion 26 is formed between the lighting control circuit 22 and the metal plate 18 in a thickness direction of the board. The lighting control circuit 22 is mounted on a surface 24a of the circuit board 24. Consequently, heat generated by components (for example, the IC) used in the lighting control circuit 22 moves not only in the thickness direction but also in a horizontal direction via the wiring portion 26 of the circuit board 24, thereby enhancing heat dissipation performance.

Also, the light-emitting diodes 20 are disposed in the respective opening portions 24b formed in the circuit board 24. Consequently, the light-emitting diodes 20 can be directly mounted on the metal plate 18. The plurality of opening portions 24b are provided in such a manner as to be spaced from each other and a light-emitting diode 20 is disposed in each opening portion 24b. Then, the different optical control regions R1 to R3 of the lens 14 are provided for the respective light-emitting diodes 20. Consequently, it is possible to provide a plurality of light sources that are different in light distribution in a single light-emitting module.

The light-emitting diodes 20 are connected to the wiring portion 26 via the metal wires 28. Consequently, reliability of connection between electrode pads 20a of the light-emitting diodes 20 and the wiring portion 26 can be enhanced. Also, use of the metal wires 28 enables reduction in area of the electrode pads 20a. Also, the area of each of the electrode pads 20a according to the present embodiment is smaller than the area of each of light-emitting surfaces of the light-emitting diodes 20. In this way, in the case where the light-emitting surfaces of the light-emitting diodes 20 face forward of the vehicle, when the vehicle lamp 10 is viewed from the front, the thin metal wires 28 and the small electrode pads 20a are inconspicuous.

As illustrated in FIG. 6, the light-emitting module 12 further includes a circuit metal plate 30 that is different from the metal plate 18. The circuit board 24 is mounted in such a manner as to extend on the metal plate 18 and the circuit metal plate 30, and the metal plate 18 and the circuit metal plate 30 are thermally separated from each other. Consequently, it is possible to set a shape and a size of the metal plate 18, which is an element metal plate, in consideration of heat generated by the light-emitting diodes 20 and to set a shape and a size of the circuit metal plate 30 in consideration of heat generated by the lighting control circuit 22. This enhances a degree of flexibility of settings.

The metal plate 18 is a single plate member and includes a rectangular cutout portion 18e provided in an outer peripheral portion 18d. The circuit metal plate 30 is inserted in the cutout portion 18e. The metal plate 18 and the circuit metal plate 30 inserted in the cutout portion 18e form a rectangular shape as a whole. Consequently, the entirety of the two metal plates forms a simple rectangular shape, thereby reducing interference with other members and conflict in sharing space with other members. This increases a degree of flexibility of layout.

Each of the metal plate 18 and the circuit metal plate 30 is a metal plate of, e.g., aluminum or copper, the metal plate having a thickness of 1 mm to 2 mm. Consequently, the light-emitting module 12 can be made thin. Also, as illustrated in FIG. 5, the lighting control circuit 22 including elements that generate a relatively large amount of heat such as the IC is disposed at a position distant from a center light-emitting diode 20A having a relatively low heat dissipation performance from among the three light-emitting diodes 20. This reduces the influence that heat generated by the lighting control circuit 22 has on the light-emitting diode 20A. Also, as illustrated in FIGS. 2 and 3, there is a certain dead space in the region surrounded by the lens 14, the metal plate 18 and the holder 16, and thus, components forming the lighting control circuit 22 are placed in the dead space. Consequently, it is possible to curb an increase in thickness of the vehicle lamp 10 in the vehicle front-rear direction due to the lighting control circuit 22.

Second Embodiment

Figure 9:
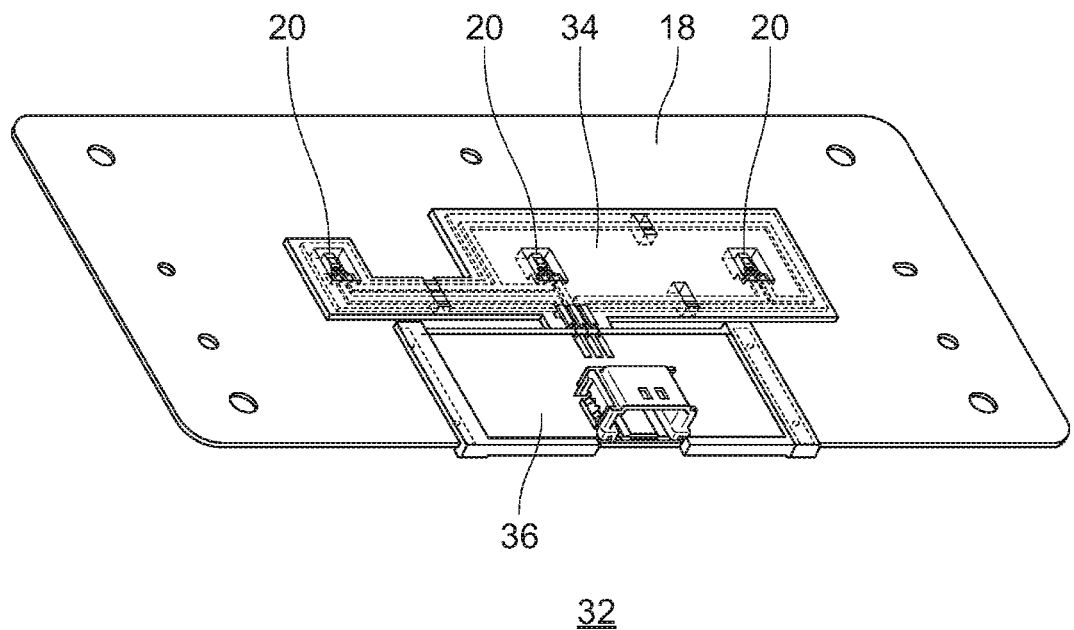
FIG. 9 is a perspective view of a light-emitting module according to a second embodiment as viewed from above.
Figure 10:
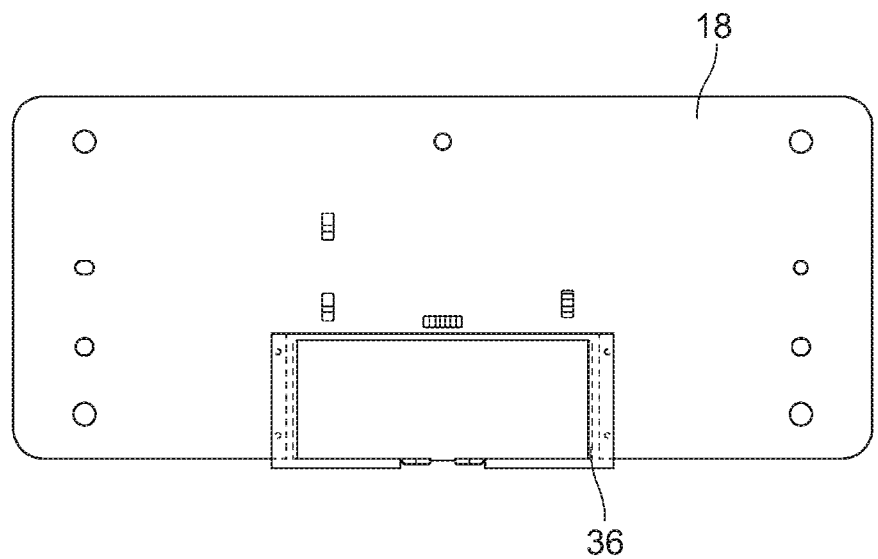
FIG. 10 is a back view of the light-emitting module according to the second embodiment.
Figure 11:
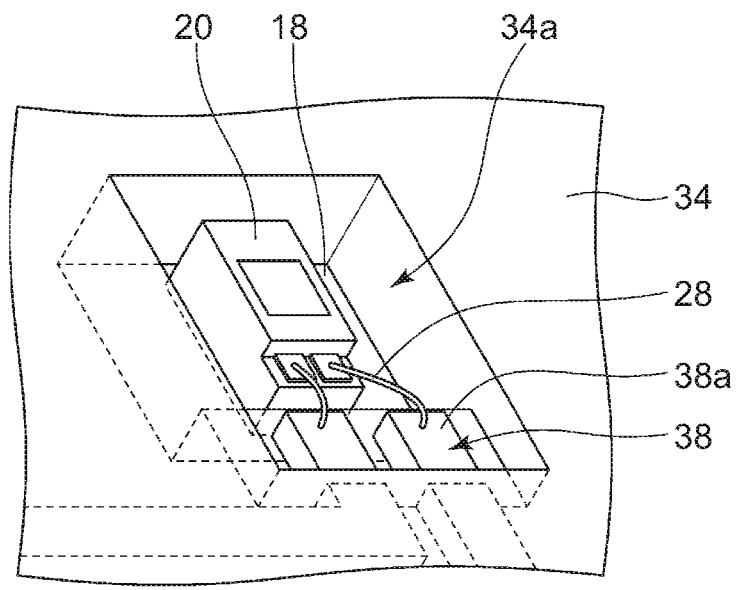
FIG. 11 is an enlarged view of the vicinity of an opening portion of the light-emitting module illustrated in FIG. 9.
Figure 12A:
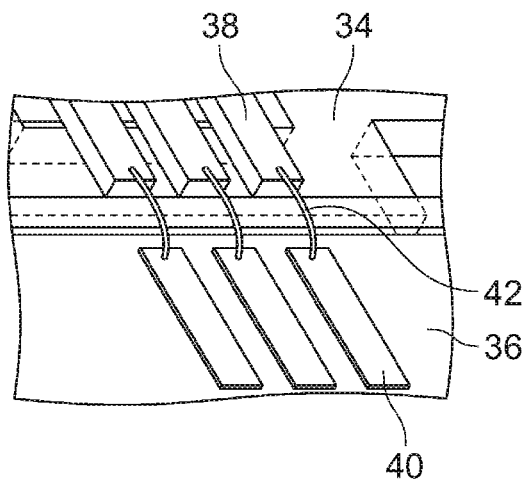
FIG. 12A is an enlarged view of the vicinity of a part of connection between a wiring board and a circuit board in the light-emitting module according to the second embodiment.
Figure 12B:
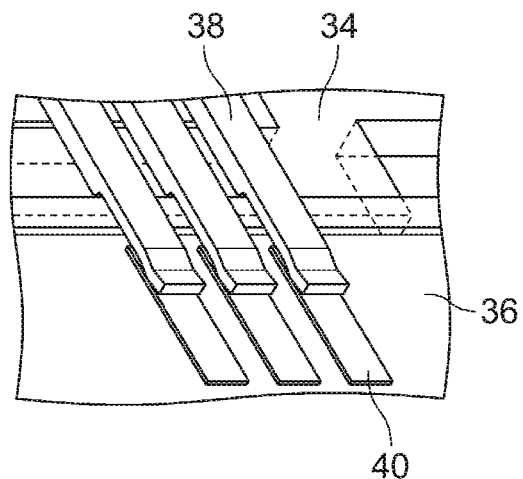
FIG. 12B is also an enlarged view of the vicinity of the part of connection between the wiring board and the circuit board in the light-emitting module according to the second embodiment.

FIG. 9 is a perspective view of a light-emitting module according to a second embodiment. FIG. 10 is a back view of the light-emitting module according to the second embodiment. FIG. 11 is an enlarged view of the vicinity of an opening portion of the light-emitting module illustrated in FIG. 9. FIGS. 12A and 12B are enlarged views of the vicinity of a part of connection between a wiring board and a circuit board in the light-emitting module according to the second embodiment.

A light-emitting module 32 includes three light-emitting diodes 20, a metal plate 18 that is an element metal plate on which the light-emitting diodes 20 are mounted, a wiring board 34 disposed on the metal plate 18, and a circuit board 36 on which a lighting control circuit (not illustrated) that controls lighting of the light-emitting diodes 20. In the wiring board 34, opening portions 34a for mounting the light-emitting diodes 20 on the metal plate 18 are provided.

In each opening portion 34a, parts 38a of wiring (bus-bars) 38 inside the wiring board 34 are exposed, and each opening portion 34a has a depth enough to surround metal wires 28 that are connecting members connecting the light-emitting diode 20 and the exposed parts 38a of the wiring 38.

Consequently, the lighting control circuit and the light-emitting diodes 20 can be connected with a simple configuration. In addition, since the opening portions 34a each have a depth D (see FIG. 8) enough to surround the relevant metal wires 28, the metal wires 28 are less likely to come into contact with other components.

The opening portions 34a are each configured such that the metal wires 28 do not project from a surface of the wiring board 34. Consequently, it is possible to avoid a situation where the metal wires 28 contact other components that the metal wires 28 should not contact, and the metal wires 28 do not need to be coated with, for example, an insulating protection resin. As a result, the light-emitting module 32 enables reduction in cost.

The wiring board 34 is a resin substrate integrally formed with the metal plate 18 and metal bus-bars. The opening portions 34a are recess portions that receive the respective light-emitting diodes 20, and parts of the bus-bars are exposed from side walls of the recess portions. Consequently, the metal wires 28 are connected to the parts of the bus-bars without projecting from the surface of the wiring board 34. Although the wiring board 34 includes an outer covering portion or a casing formed by an engineering plastic and the bus-bars provided inside the outer covering portion or the casing, the wiring board of the disclosure is not limited to this example, and may be a multilayer resin substrate with a copper foil pattern embedded as a wiring portion. A circuit metal plate that is different from the metal plate 18 may further be provided.

As illustrated in FIG. 12A, with regard to connection between the wiring board 34 and the circuit board 36, end portions of the bus-bars that are included in the wiring 38, and end portions of copper foil patterns that are included in a wiring portion 40 of the circuit board 36, are connected via metal jumper wires 42. Alternatively, as illustrated in FIG. 12B, end portions of the wiring 38 may be formed in such a manner as to extend onto the wiring portion 40 of the circuit board 36, and the wiring 38 may be processed in such a manner as to bias the wiring portion 40 with the use of spring property. The wiring board 34 and the circuit board 36 may be included in a common single substrate. Consequently, the number of substrates is reduced. This reduces costs for members such as the jumper wires connecting the substrates, and reduces manhours for assembly.

Third Embodiment

Figure 13A:
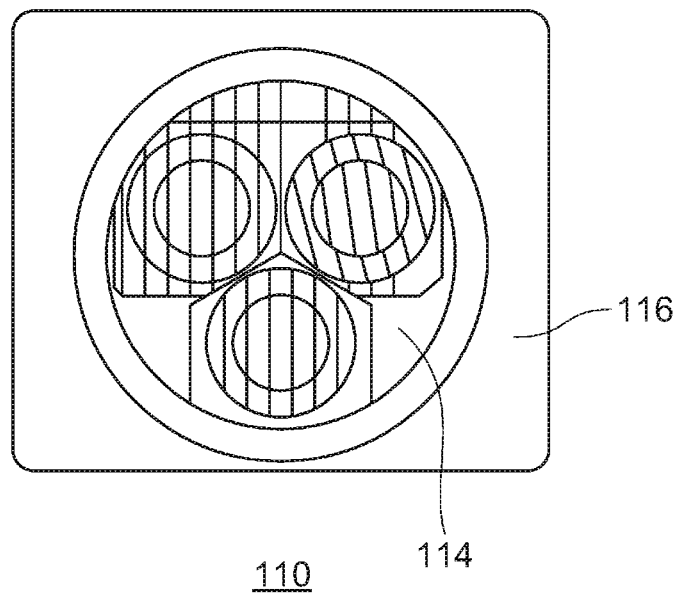
FIG. 13A is a front view of a vehicle lamp according to a third embodiment and FIG. 13B is a perspective view of the vehicle lamp according to the third embodiment.
Figure 13B:
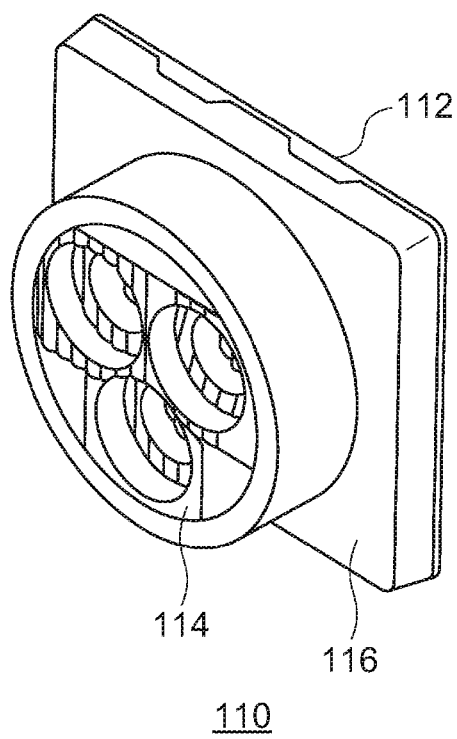
Figure 14:
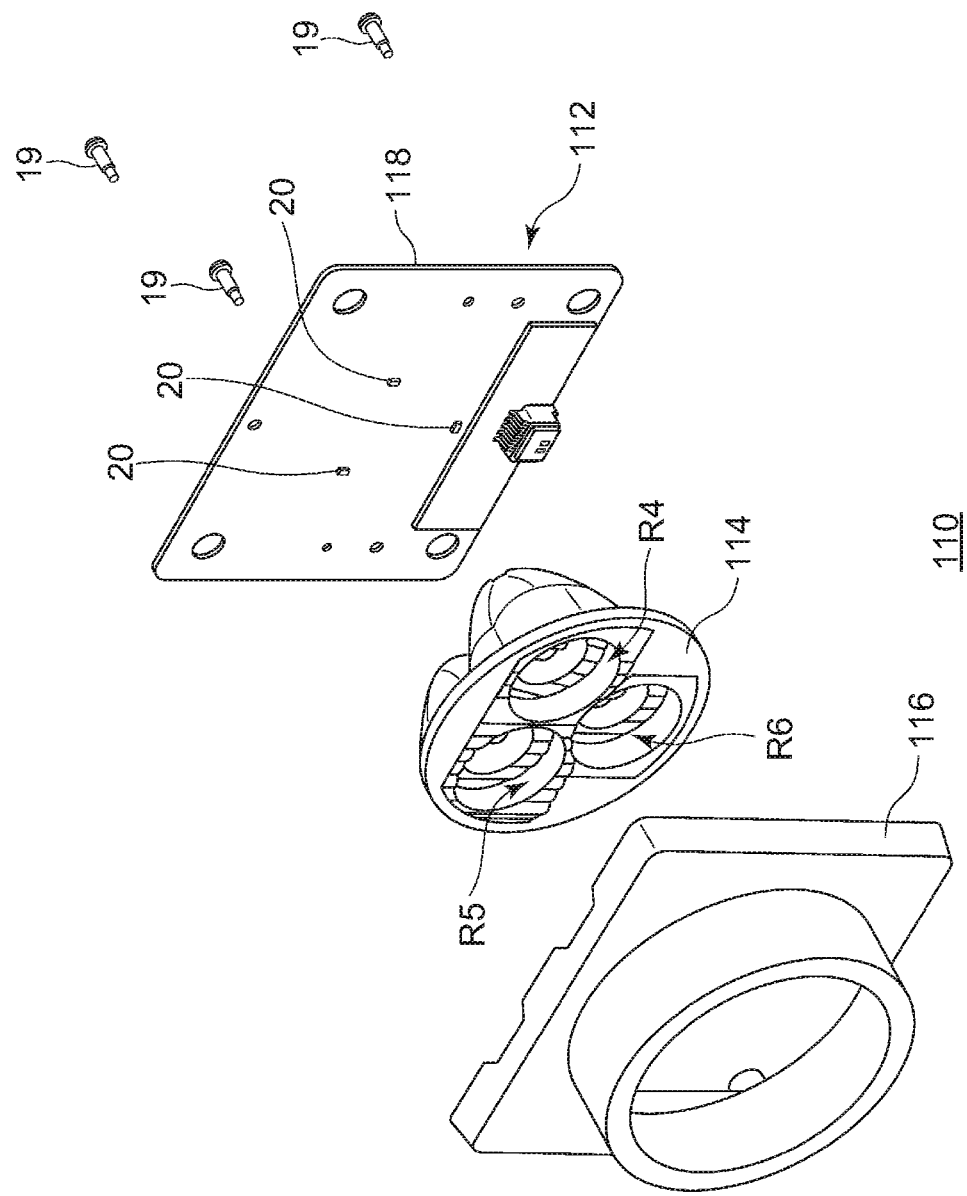
FIG. 14 is an exploded perspective view of the vehicle lamp according to the third embodiment.

FIG. 13A is a front view of a vehicle lamp according to a third embodiment and FIG. 13B is a perspective view of the vehicle lamp according to the third embodiment. FIG. 14 is an exploded perspective view of the vehicle lamp according to the third embodiment. Note that components that are similar to components of the vehicle lamp 10 according to the first embodiment are provided with signs that are the same as the signs of the components in the first embodiment and description of such components are appropriately omitted.

A vehicle lamp 110 includes a light-emitting module 112, a lens 114 and a holder 116. The light-emitting module 112 includes a metal plate 118 formed of, e.g., aluminum or copper, and three semiconductor light-emitting elements (light-emitting diodes 20) mounted on the metal plate 118, the semiconductor light-emitting elements being separate light sources. The three light-emitting diodes 20 are disposed at respective positions corresponding to corners of a triangle (an equilateral triangle or an isosceles triangle).

The lens 114 includes three optical control regions R4 to R6. In each of the optical control regions R4 to R6, an optical path is controlled such that light L emitted from the relevant light-emitting diode 20 enters the optical control region, travels through the inside of the optical control region and exits forward from the optical control region. The optical control regions R4 to R6 are provided in such a manner as to form a triangle in front of the three light-emitting diodes 20.

Although the disclosure has been described with reference to the embodiments above, the disclosure is not limited to the above embodiments, and the disclosure includes embodiments obtained by appropriately combining or substituting components of the embodiments. Also, combinations or the order of processing steps in the embodiments may be appropriately changed based on knowledge of a person skilled in the art, and modifications such as various design changes may be made to the embodiments. Such modified embodiments can also be included in the scope of the disclosure.

What is claimed is:

1. A light-emitting module comprising:
   a semiconductor light-emitting element;
   a circuit board on which a lighting control circuit configured to perform control to turn on and off the semiconductor light-emitting element is provided;
   an element metal plate on which the semiconductor light-emitting element is mounted; and
   a circuit metal plate that is different from the element metal plate, wherein:
   the circuit board is mounted in such a manner as to extend on the element metal plate and the circuit metal plate; and
   the element metal plate and the circuit metal plate are thermally separated from each other,
   the circuit board is a resin substrate in which a wiring portion connecting the semiconductor light-emitting element and the lighting control circuit is provided;
   the element metal plate is a single plate member;
   a cutout portion in which the circuit metal plate is inserted is provided in an outer peripheral portion of the element metal plate; and
   the element metal plate and the circuit metal plate inserted in the cutout portion form a rectangular shape as a whole.

2. The light-emitting module according to claim 1,
   wherein the circuit board is a multilayer substrate, and the wiring portion is provided inside the multilayer substrate; and
   wherein the wiring portion includes a first portion which extends in a thickness direction of the circuit board and a second portion which extends in a direction parallel to a top surface of the circuit board, and
   both the first portion and the second portions are provided inside the circuit board.

3. The light-emitting module according to claim 1, wherein:
   the circuit board is mounted on the element metal plate; and
   the wiring portion is provided between the lighting control circuit and the element metal plate.

4. The light-emitting module according to claim 1, wherein the semiconductor light-emitting element is disposed in an opening provided in the circuit board.

5. The light-emitting module according to claim 1, further comprising
- a circuit metal plate that is different from the element metal plate, wherein:
- the circuit board is mounted in such a manner as to extend on the element metal plate and the circuit metal plate; and
- the element metal plate and the circuit metal plate are thermally separated from each other.

6. The light-emitting module according to claim 1, wherein the element metal plate has a thickness of 1 mm to 2 mm.

7. The light-emitting module according to claim 4, wherein the semiconductor light-emitting element is connected to the wiring portion via a metal wire.

* * * * *